United States Patent
Siedow et al.

(10) Patent No.: US 6,262,888 B1
(45) Date of Patent: Jul. 17, 2001

(54) IMPACT DAMPING SYSTEM FOR PERIPHERAL DEVICE

(75) Inventors: Roger A. Siedow; Jason A. Shepherd; Eugene Buican, all of Austin, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/345,239

(22) Filed: Jun. 30, 1999

(51) Int. Cl.[7] .............................. H05K 5/02; H05K 5/00; H05K 7/16; A47B 46/00
(52) U.S. Cl. ........................ 361/685; 361/683; 361/686; 361/728; 312/270.2; 312/249.7
(58) Field of Search ................................... 361/683–686, 361/724, 725, 728, 747; 312/332.1, 333, 270.2, 270.3, 249.1, 249.7; 248/240, 291.1, 225.11

(56) References Cited

U.S. PATENT DOCUMENTS

| | | | |
|---|---|---|---|
| 3,781,046 | * 12/1973 | Hinkle | 292/264 |
| 3,868,158 | * 2/1975 | Laboue | 312/350 |
| 4,181,339 | * 1/1980 | Rigsby | 292/347 |
| 4,705,257 | 11/1987 | Leo et al. . | |
| 4,713,714 | * 12/1987 | Gatti et al. | 360/137 |
| 4,833,554 | 5/1989 | Dalziel et al. . | |
| 5,032,952 | * 7/1991 | Cooke et al. | 361/392 |
| 5,136,466 | * 8/1992 | Remise et al. | 361/391 |
| 5,149,048 | 9/1992 | Morehouse et al. . | |
| 5,172,305 | * 12/1992 | DeWilde | 361/415 |
| 5,216,582 | 6/1993 | Russell et al. . | |
| 5,402,308 | * 3/1995 | Koyanagi et al. | 361/685 |
| 5,463,527 | 10/1995 | Hager et al. . | |
| 5,483,397 | 1/1996 | Gifford et al. . | |
| 5,491,608 | * 2/1996 | Koyanagi et al. | 361/685 |
| 5,535,092 | 7/1996 | Bang . | |
| 5,553,412 | * 9/1996 | Briechle et al. | 40/642 |
| 5,566,383 | * 10/1996 | Gildea et al. | 361/685 |
| 5,572,402 | 11/1996 | Jeong . | |
| 5,587,855 | 12/1996 | Kim . | |
| 5,680,293 | * 10/1997 | McAnally et al. | 361/685 |
| 5,703,734 | 12/1997 | Berberich et al. . | |
| 5,706,168 | 1/1998 | Erler et al. . | |
| 5,760,998 | 6/1998 | Berberich et al. . | |
| 5,777,845 | * 7/1998 | Krum et al. | 361/685 |
| 5,808,864 | * 9/1998 | Jung | 361/685 |
| 5,997,115 | * 12/1999 | Radloff et al. | 312/222 |
| 6,040,980 | * 3/2000 | Johnson | 361/685 |

FOREIGN PATENT DOCUMENTS

| | | | |
|---|---|---|---|
| 6-236669 | * 8/1994 | (JP) | 369/263 |
| 10-207571 | * 8/1998 | (JP) | G06F/1/16 |

* cited by examiner

Primary Examiner—Leo P. Picard
Assistant Examiner—Anatoly Vortman
(74) Attorney, Agent, or Firm—Haynes and Boone, LLP

(57) ABSTRACT

A computer system including a chassis having a wall with a raised mounting portion protruding therefrom and a mounting flange attached adjacent to the wall. A peripheral device is pivotally mounted on the mounting flange. A resilient damping member is positioned adjacent the wall for being engaged by the peripheral device. The resilient damping member is compressed from a first height to a second height in response to the peripheral device being pivoted from a first position to a second position for reducing impact loadings associated with installing the peripheral device in the computer system. The resilient damping member controls the impact imposed on the peripheral device.

16 Claims, 2 Drawing Sheets

IMPACT DAMPING SYSTEM FOR PERIPHERAL DEVICE

BACKGROUND

The disclosures herein relate generally to computer systems and more particularly to impact damping systems for peripheral devices in a computer system.

Peripheral devices such as high performance hard drives require rigid mounting to the chassis of a computer system to achieve optimum performance. The servo tracking performance is hindered by displacement of the disk drive unit in response to inertial forces associated with movement of the head actuator arms. Reducing, or preferably, eliminating movement of the disk drive body relative to the chassis of the computer system allows a desired string of data to be read from the disk drive more readily and accurately.

However, the force associated with mounting the disk drive against a rigid surface in a high-speed computer assembly operation results in high G-load impacts. If the impact is great enough, one or more of the heads in the disk drive may experience an impact-induced head crash. An impact-induced head crash occurs when one or more of the heads in the disk drive collide against the surface of an adjacent disk. A head crash may damage the head or the disk, resulting in reduced performance and reliability. The damage may result in immediate failure or undetected damage leading to a shortened operating life.

Attempts have been made at providing damping devices that protect against loads applied directly to the case of a hard disk drive. For example, U.S. Pat. Nos. 5,760,998 and 5,703,734 disclose hard disk drives that incorporate resilient members protruding from the exterior of the drive case to protect against impact loadings from flat drops. U.S. Pat. No. 5,535,092 discloses a hard disk drive that incorporates resilient members attached to protrude from the corners of the drive case to protect against the case being dropped on a corner.

Although attempts have been made to provide systems and techniques for damping impact loadings resulting from the disk drive being dropped prior to installation, none disclose a reliable, efficient and cost-effective damping system for minimizing damage associated with positioning the drive for attachment of retaining fasteners during the computer assembly process and for allowing a rigid mounting configuration. Accordingly, there is a need for an apparatus and method of assembly that overcomes the shortcomings of present mounting configurations and installation techniques for peripheral devices.

SUMMARY

One embodiment, accordingly, provides a method and apparatus for reducing the impact loadings associated with installing a peripheral device such as a hard disk drive in a computer system. To this end, one embodiment provides a computer system chassis including a wall having a raised mounting portion protruding therefrom and a mounting flange attached adjacent to the wall. The mounting flange is configured to have a peripheral device pivotally mounted thereon for movement between a first position and a second position. A resilient damping member is positioned adjacent the wall for being engaged by the peripheral device, the resilient damping member is compressible from a first height to a second height in response to the peripheral device being pivoted from the first position to the second position.

A principal advantage of the embodiments of the impact damping system presented herein is that the reduction of impact exhibited during assembly of a peripheral device in a computer system dramatically improves the reliability and performance of the installed peripheral device.

BRIEF DESCRIPTION OF THE DRAWING FIGURES

DETAILED DESCRIPTION

Figure 1A:
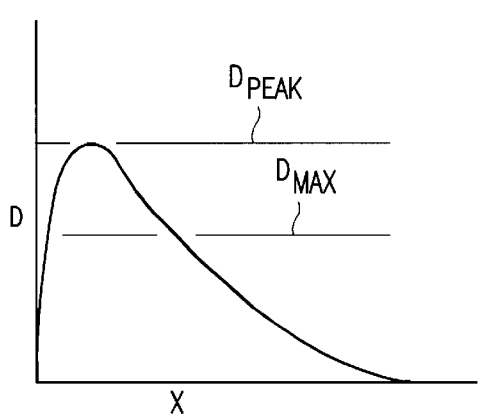
FIG. 1a is a graphical representation of a deceleration curve for a body decelerated by a resilient member having spring-like characteristics.

A deceleration curve for a resilient member, illustrated in FIG. 1a, such as a solid elastomeric pad, exhibits generally spring-like properties when acted on by a body subjecting the resilient member to a high-speed deformation loading. For this type of resilient member and loading characteristics, the magnitude of the deceleration experienced by the body rapidly increases to its peak deceleration value Dpeak. The peak deceleration Dpeak may be in excess of a maximum desired deceleration Dmax. For this type of loading and resilient member construction, relatively small displacements of the resilient member result in relatively large deceleration values.

Figure 1B:
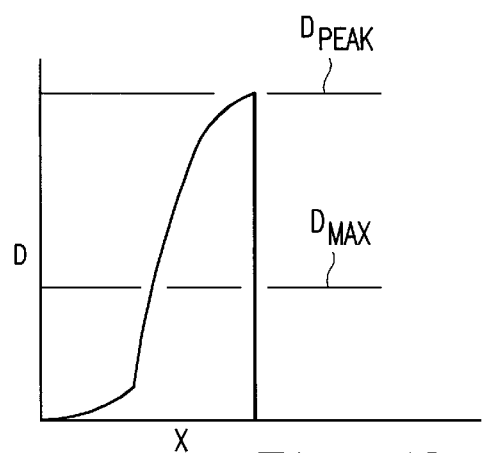
FIG. 1b is a graphical representation of a deceleration curve for a body decelerated by a resilient member that transitions to a non-resilient member during deceleration of the body.

A deceleration curve for a resilient member that offers minimal displacement prior to the resilient member deforming to a point at which its resiliency approaches that of a solid body, is illustrated in FIG. 1b. This curve also represents the situation in which the effective range of deformation of the resilient member is insufficient to preclude the body from contacting an adjacent immovable or generally rigid structure prior to being sufficiently decelerated. The limited displacement capacity of this type of resilient damping member may be due to factors such as the resilient member having to be made too thin to satisfy other requirements for the given application. When acted on by a body that subjects the resilient member to a high-speed deformation loading, the magnitude of the deceleration of the body increases at a relatively moderate rate followed by a very rapid increase until it reaches the peak deceleration value Dpeak. As with the example provided in FIG. 1, this peak value may be in excess of a maximum desired deceleration Dmax.

A deceleration curve for a resilient member having predominantly damper-like characteristics is illustrated in FIG.

1c. A resilient member of this type is largely insensitive to the rate of deformation loading such that even for high-speed deformation loadings, the resilient member exhibits damper-like characteristics rather than spring-like characteristics. The force curve of a spring is a function of displacement whereas the force curve of a damper is a function of the rate of change of speed. Therefore, for a high speed impact loading, a relatively flat deceleration curve is easily attained with a resilient member exhibiting damper-like characteristics.

Figure 1C:
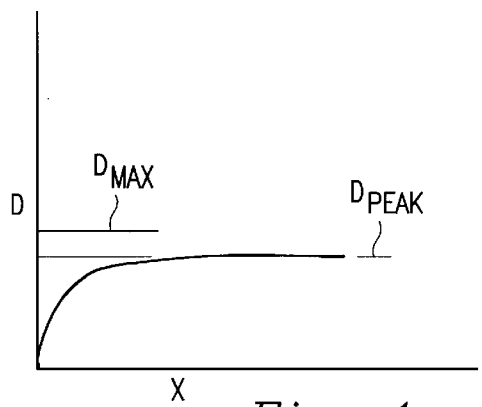
FIG. 1c is a graphical representation of a deceleration curve for body being decelerated by a resilient member having damper-like characteristics.

For the same impact loading represented in FIGS. 1a and 1b, the deceleration curve illustrated in FIG. 1c is relatively flat over the majority of the displacement. As shown, following a relatively rapid yet short rise in the deceleration curve, the deceleration curve becomes relatively flat. Furthermore, due to the flatness of the curve, the peak deceleration Dpeak does not reach or exceed the maximum desired deceleration Dmax.

It should be understood that for a given impact loading, the area under the deceleration curve for a given differential in speed will be essentially equal regardless of the specific apparatus utilized for decelerating the body. As the area under the curve represents the energy expended to decelerate a mass from a first speed to a second speed, conservation of energy dictates that the energy required to decelerate a body of a given mass from a first velocity to a second velocity must be the same. However, as illustrated in FIGS. 1a–1c, the profile of the deceleration curve will differ for different apparatus. Note that the curves of FIGS. 1a–1c are not drawn to scale, but are intended to show general trends for the various types of damping apparatus.

It is desirable to provide a method and apparatus for damping the impact associated with installing a peripheral device in a computer system. It is an object of the present embodiments to preclude impact sensitive peripheral devices from being subjected to an impact that will produce a deceleration in excess of the recommended maximum impact loading. In the case of a peripheral device being installed in the chassis of a computer system, the maximum impact loading associated with the installation process corresponds to the peak deceleration Dpeak. For example, when mounting a hard drive against a wall in a chassis, the peak deceleration Dpeak is generally attributed to the hard disk drive being impacted against the wall.

A typical commercially available hard disk drive is rated to withstand an impact loading of as much as 100 times gravitational acceleration, also commonly referred to as 100 g's. Without a resilient damper, hard disk drives have been found to experience impact loadings in excess of 100 g's for an assembly process such as that illustrated in FIGS. 3 and 4. The rate of change of speed between the first speed and the second speed determines the peak deceleration value exhibited by the peripheral device for any given peripheral device, assembly process and mounting configuration. Accordingly, it is desirable to employ a suitable damping apparatus in the chassis of a computer system to preclude the peak deceleration value from exceeding the maximum recommended deceleration value for a given peripheral device during installation of the peripheral device in a computer system chassis.

Figure 2:
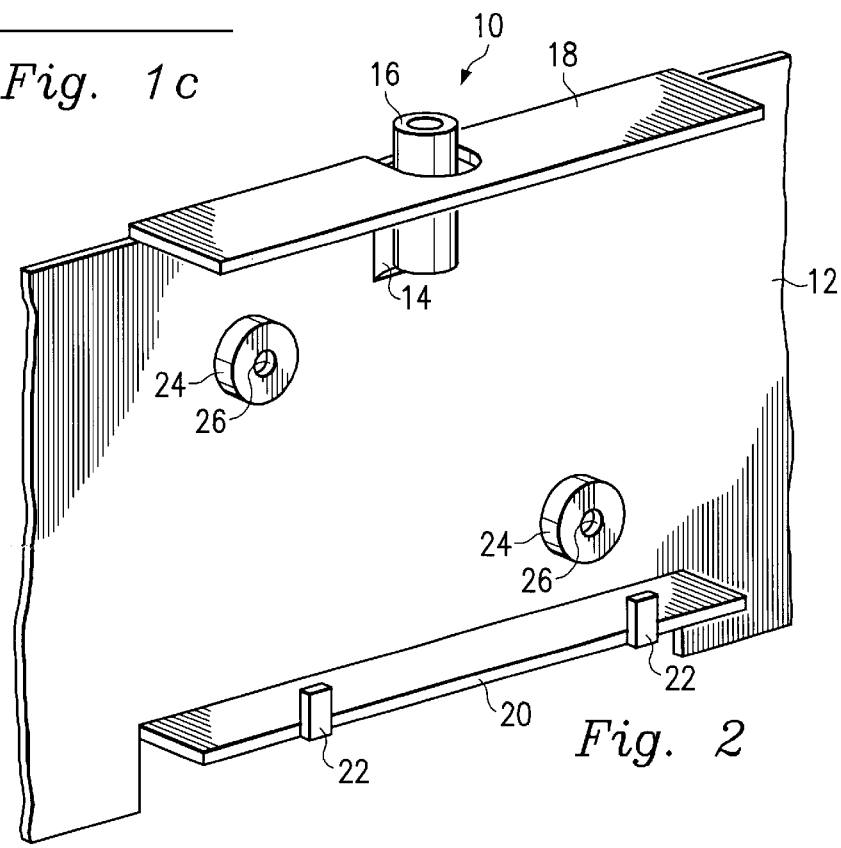
FIG. 2 is a partial perspective view illustrating an embodiment of a computer system chassis having an integral resilient damping apparatus.

As illustrated in FIG. 2, an embodiment of a chassis 10 includes a main wall 12 having a recess 14 formed therein. A resilient damping member 16 is mounted in the recess 14. The chassis 10 also includes a side wall 18 that extends generally perpendicular to the main wall 12. A mounting flange 20 extends from the main wall 12 in a direction generally parallel to the side wall 18. The mounting flange 20 includes one or more pins 22 for being engaged by a peripheral device during the assembly process. The main wall 12 also includes two raised mounting portions 24. Each raised mounting portion 24 includes a hole 26 formed therethrough for receiving a fastener.

It has been found that a material such as a visco-elastic PVC is preferred for the resilient damping member 16. More particularly, a tubing formed from a visco-elastic material has been found to provide the desired damping characteristics. For example, a visco-elastic tubing having a hardness of approximately 83 Shore A with outside and inside diameters of 0.313 and 0.187 inches, respectively, has been found to reduce the impact loading of a hard disk drive in a high speed assembly process from more than 100 g's to approximately 88 g's or less. Anderson-Barrows Incorporated of Palmdale California manufactures a visco-elastic PVC tubing (commercially available as stock number 048643-025882) according to the tubing specifications identified above. A cost effective resilient damping member may be formed by cutting this tubing into lengths approximately 0.642 inches long. Damping members providing the same function yet having different sizes and shapes are contemplated.

Techniques and materials for computer system chassis fabrication are well known. Typically, a chassis is fabricated from thin sheets of steel or aluminum using conventional metal bending and punching processes. Conventional chassis are commercially available from a number of sources such as Palo Alto Products International and from FoxConn Corporation.

As shown in FIG. 2, the various walls and features of the chassis may be formed as unitary features of the chassis 10. However, the various walls and features associated with the mounting of a peripheral device may also be formed separately from the chassis 10 and attached to it using a variety of different fastening techniques such as threaded fasteners, rivets or the like. A primary benefit of these walls and features being unitary with the chassis 10 is that the additional cost of forming the various walls and features simultaneously with the chassis 10 is negligible.

Figure 3:
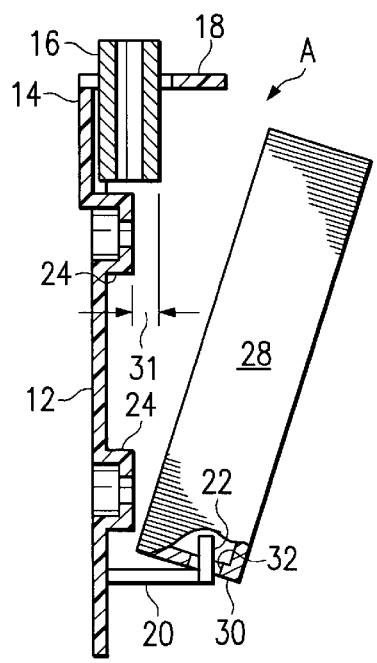
FIG. 3 is a cross-sectional end view illustrating an embodiment of a peripheral device in a first position during mounting in a computer system chassis.
Figure 4:
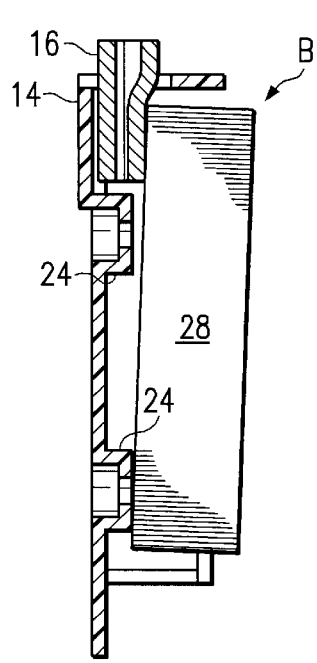
FIG. 4 is a cross-sectional end view illustrating an embodiment of a peripheral device in a second position during mounting in a computer system chassis.
Figure 5:
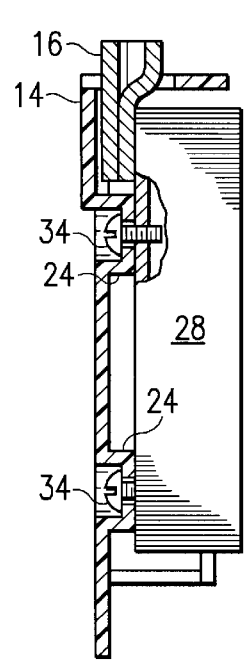
FIG. 5 is a cross-sectional end view illustrating an embodiment of a peripheral device mounted rigidly against the chassis.

An assembly process for mounting a peripheral device 28 such as a hard disk drive to a chassis 10, is illustrated in FIGS. 3–5. As illustrated in FIG. 3, the peripheral device 28 is positioned with a side 30 adjacent the mounting flange 20. The pins 22 of the mounting flange 20 are received in respective holes 32 formed in the peripheral device 28. The peripheral device 28 can then be pivoted from a first position A, FIG. 3, to a second position B, FIG. 4.

The resilient damping member 16, FIG. 3, and raised mounting portions 24 define a deceleration zone 31. The resilient damping member 16, recess 14 and raised mounting portions 24 are configured such that the resilient damping member 16 is compressed from a first height to a second height to decelerate the peripheral device 28 from a first speed to a second speed. The first and second height of the resilient damping member define the range of the deceleration zone 31. The specific configuration of the resilient damping member ensures that the peripheral device 28 does not experience a deceleration value that exceeds the maximum recommended impact loading of the peripheral device.

The peripheral device 28, FIG. 5, is rigidly mounted to main wall 12 using fasteners 34. The peripheral device 28 includes a side 29 engaged against the raised mounting portions 24 of the main wall 12. It should be noted that for a visco-elastic resilient damping member, the height of the raised mounting portions 24 and the depth of the recess 14 serve to define the effective minimum crush height of the resilient member 16. The recess 14, raised mounting portions 24 and the resilient damping member 16 are configured to provide a crush height enabling the peripheral device 28 to be fastened against the raised mounting portions 24 of the main wall 12 without significant force being exerted by the resilient damping member 16. Although the raised mounting portions 24, pins 22 and the fasteners 34 are illustrated, other suitable mounting configurations accomplishing the same function are contemplated.

Figure 6:
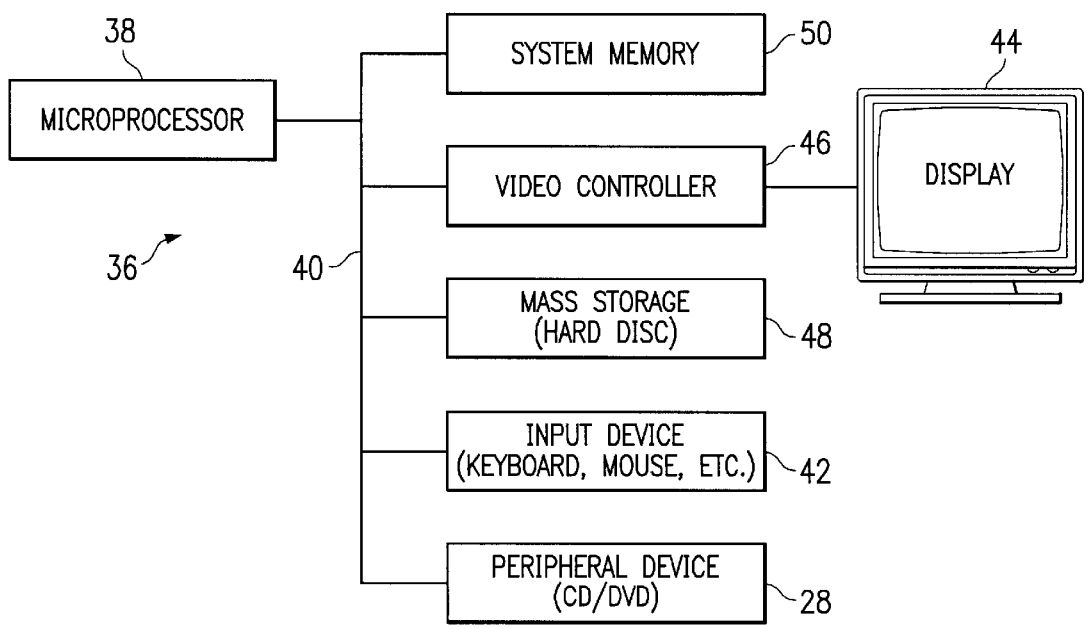
FIG. 6 is a block diagram illustrating an embodiment of a computer system.

Referring to FIG. 6, illustrated is an embodiment of a computer system, indicated generally at 36. The computer system 36 includes at least one microprocessor 38. The microprocessor 38 is connected to a bus 40. The bus 40 serves as a connection between the microprocessor 38 and other components of the computer system 36. An input device 42 is coupled to the microprocessor 38 to provide input to the microprocessor 38. Examples of input devices include keyboards, touchscreens, and pointing devices such as a mouse, a trackball and a trackpad. The computer system 36 may also include a display 44 which is coupled to the microprocessor 38 typically by a video controller 46. Programs and data are stored on a mass storage device 48 which is coupled to the microprocessor 38. Mass storage devices include components such as hard disks, optical disks, magneto-optical drives, floppy drives, and the like. A system memory 50 provides the microprocessor 38 with fast storage to facilitate execution of computer programs by the microprocessor 38. The peripheral device 28 may be connected to the microprocessor 38 for providing the computer system 36 with additional functionality. Examples of peripheral devices include floppy disk drives, hard disk drives, compact disc players, digital video disc players, memory card readers, and other types of ancillary devices. The various components of the computer system are typically mounted in a chassis. It should be understood that other busses and intermediate circuits can be employed between the components described above and microprocessor 38 to facilitate interconnection between the components and the microprocessor.

In operation, a first edge of the disk drive is pivotally engaged with the pins on the mounting flange that is attached to the computer system chassis. The disk drive is pivotally moved from a first position to a second position to bring a face of the disk drive into engagement with the raised mounting portions of the chassis. At an intermediate position between the first and second positions, a damper engages the face of the disk drive. The damper is configured to decelerate the disk drive at a rate whereby the initial contact of the face against the damper and the loadings associated with the deceleration of the disk drive do not cause an impact-induced head crash.

One embodiment provides a computer system chassis including a wall having a raised mounting portion protruding therefrom and a mounting flange attached adjacent to the wall. The mounting flange is configured to have a peripheral device pivotally mounted thereon for movement between a first position and a second position. A resilient damping member is positioned adjacent to the wall for being engaged by the peripheral device. The resilient damping member is compressible from a first height to a second height in response to the peripheral device being pivoted from the first position to the second position.

Another embodiment provides a peripheral support system including a chassis having a wall with a raised mounting portion protruding therefrom and a mounting flange attached adjacent to the wall. A peripheral device is pivotally mounted on the mounting flange for movement between a first position and a second position. A resilient damping member is positioned adjacent to the wall for being engaged by the peripheral device. The resilient damping member is compressed from a first height to a second height in response to the peripheral device being pivoted from the first position to the second position.

Yet another embodiment provides a computer system including a chassis having a wall with a raised mounting portion protruding therefrom and a mounting flange attached adjacent to the wall. A microprocessor is mounted in the chassis. An input is coupled to provide input to the microprocessor and a mass storage device is coupled to the microprocessor. A display is coupled to the microprocessor by a video controller and a system memory is coupled to provide storage to facilitate execution of computer programs by the microprocessor. A peripheral device is pivotally mounted on the mounting flange for movement between a first portion and a second portion. A resilient damping member is positioned adjacent to the wall for being engaged by the peripheral device. The resilient damping member is compressed from a first height to a second height in response to the peripheral device being pivoted from a first position to a second position.

A further embodiment provides a method of mounting a device in a computer system including the steps of providing a chassis including a wall having a raised mounting portion protruding therefrom and a mounting flange attached adjacent to the wall; mounting a resilient damping member adjacent the wall; pivotally mounting a peripheral device on the mounting flange; and pivoting the peripheral device from a first position to a second position. The resilient damping member is compressed from a first height to a second height in response to the peripheral device being pivoted from a first position to a second position.

Still a further embodiment provides a method of making a computer system chassis including the steps forming a wall having a raised mounting portion protruding therefrom and a mounting flange attached adjacent to the wall pivotally mounting a peripheral device on the mounting flange; and mounting a resilient damping member adjacent the first wall. The resilient damping member is compressible from a first height to a second height in response to the peripheral device being pivoted from a first position to a second position.

As it can be seen, the embodiments presented herein provide several advantages. The reduction of impact exhibited during assembly of a hard disk drive in a computer system dramatically improves the reliability and performance of a hard disk drive. The present damper system provides a cost-effective solution to reducing impact related failures. A rigid mounting may be accomplished without complex mounting structures. Minimal modifications are required to the hard disk drive chassis mounting structure. No modifications are required to the hard disk drive. The present damping system provides an approximately flat line deceleration curve over a critical range of displacement of the disk drive.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A computer system chassis, comprising:

a wall including a raised mounting portion protruding therefrom;

a mounting flange adjacent to the wall, the mounting flange configured to have a peripheral device pivotally mounted thereon for movement between a first position and a second position; and a resilient damping member positioned adjacent to the wall for engagement with the peripheral device, the resilient damping member being compressible from a first height to a second height in response to the peripheral device being pivoted from the first position to the second position, wherein the resilient damping member provides a deceleration curve having a transient portion and a steady state portion, the steady state portion being generally flat.

2. The computer system chassis of claim 1 wherein the resilient damping member decelerates the peripheral device from a first speed to a second speed in response to the resilient damping member being compressed from the first height to the second height.

3. The computer system chassis of claim 2 wherein the peripheral device is subjected to a maximum deceleration of 100 times gravitational acceleration in response to compressing the resilient damping member from the first height to the second height.

4. The computer system chassis of claim 1 wherein the resilient damping member includes a tubular shaped portion formed from a polymeric material.

5. The computer system chassis of claim 1 wherein the resilient damping member is an elongated tube formed from a polymeric material.

6. The computer system chassis of claim 1 wherein the resilient damping member is mounted in a recess formed in the wall.

7. The computer system chassis of claim 1 further comprising a recess formed in the wall and wherein the resilient damping member is mounted in the recess.

8. The computer chassis system of claim 7 wherein the recess is adjacent the raised mounting portion.

9. The computer system chassis of claim 1 wherein the resilient damping member is compressed from a first height to a second height in response to the peripheral device being pivoted from a first position to a second position.

10. The computer system chassis of claim 1 wherein the resilient damping member decelerates the peripheral device from a first speed to a second speed in response to the resilient damping member being compressed from the first the first height to the second height.

11. A peripheral support system, comprising:

a chassis including a wall having a raised mounting portion protruding therefrom and a mounting flange attached adjacent to the wall;

a peripheral device pivotally mounted on the mounting flange for movement between a first position and a second position; and a resilient damping member positioned adjacent to the wall for engagement with the peripheral device, the resilient damping member being compressed from a first height to a second height in response to the peripheral device being pivoted from the first position to the second position, wherein the resilient damping member provides a deceleration curve having a transient portion and a steady state portion, the steady state portion being generally flat.

12. The computer system of claim 11 wherein the resilient damping member decelerates the peripheral device from a first speed to a second speed in response to the resilient damping member being compressed from the first height to the second height.

13. The computer system of claim 12 wherein the peripheral device is subjected to a maximum deceleration of 100 times gravitational acceleration in response to compressing the resilient damping member from the first height to the second height.

14. A computer system, comprising:

a chassis including a wall having a raised mounting portion protruding therefrom and a mounting flange attached adjacent to the wall;

a microprocessor mounted in the chassis;

an input coupled to provide input to the microprocessor;

a mass storage coupled to the microprocessor;

a video controller coupled to the microprocessor;

a system memory coupled to provide storage to facilitate execution of computer programs by the microprocessor;

a peripheral device pivotally mounted on the flange for movement between a first position and a second position; and a resilient damping member positioned adjacent to the wall for engagement with the peripheral device, the resilient damping member being compressible from a first height to a second height in response to the peripheral device being pivoted from the first position to the second position, wherein the resilient damping member provides a deceleration curve having a transient portion and a steady state portion, the steady state portion being generally flat.

15. The computer system of claim 14 wherein the resilient damping member decelerates the peripheral device from a first speed to a second speed in response to the resilient damping member being compressed from the first height to the second height.

16. The computer system of claim 15 wherein the peripheral device is subjected to a maximum deceleration of 100 times gravitational acceleration in response to compressing the resilient damping member from the first height to the second height.

* * * * *